United States Patent
Brouillette et al.

(10) Patent No.: US 6,271,102 B1
(45) Date of Patent: *Aug. 7, 2001

(54) METHOD AND SYSTEM FOR DICING WAFERS, AND SEMICONDUCTOR STRUCTURES INCORPORATING THE PRODUCTS THEREOF

(75) Inventors: Donald W. Brouillette, St. Albans, VT (US); Robert F. Cook, Putnam Valley, NY (US); Thomas G. Ference, Essex Junction; Wayne J. Howell, Williston, both of VT (US); Eric G. Liniger, Danbury, CT (US); Ronald L. Mendelson, Richmond, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/032,151

(22) Filed: Feb. 27, 1998

(51) Int. Cl.$^7$ .................. H01L 21/301; H01L 21/46; H01L 21/78; B26D 3/00; B26D 3/02; B26D 3/08

(52) U.S. Cl. .................. 438/462; 438/460; 438/113; 83/869; 83/885; 83/51

(58) Field of Search ..................... 438/460, 462, 438/401, 114, 42; 83/51, 869, 885

(56) References Cited

U.S. PATENT DOCUMENTS

| | | |
|---|---|---|
| 4,015,175 | 3/1977 | Kendall et al. . |
| 4,104,697 | 8/1978 | Kendall et al. . |
| 4,292,576 | 9/1981 | Watts . |
| 4,312,115 * | 1/1982 | Diedrich et al. ........................ 29/572 |
| 4,721,977 | 1/1988 | Fukae . |
| 4,729,971 | 3/1988 | Coleman . |
| 4,814,296 | 3/1989 | Jedlicka et al. . |
| 4,846,032 | 7/1989 | Jampathom et al. . |
| 4,900,283 * | 2/1990 | Fukae ..................................... 445/22 |
| 4,985,982 | 1/1991 | Lohr et al. . |
| 5,000,811 * | 3/1991 | Campanelli ........................... 156/264 |
| 5,217,907 | 6/1993 | Bulucea et al. . |
| 5,219,796 * | 6/1993 | Quinn et al. ........................... 437/227 |
| 5,272,114 * | 12/1993 | van Berkum et al. ................ 437/226 |
| 5,369,060 * | 11/1994 | Baumann et al. ..................... 437/226 |
| 5,477,065 | 12/1995 | Nakagawa et al. . |
| 5,786,266 * | 7/1998 | Boruta .................................. 438/462 |
| 5,843,831 * | 12/1998 | Chung et al. ......................... 438/401 |
| 5,858,808 * | 1/1999 | Igel et al. ............................... 438/42 |
| 5,943,591 * | 8/1999 | Vokoun et al. ....................... 438/462 |
| 5,998,238 * | 12/1999 | Kosaki .................................. 438/114 |
| 6,124,148 * | 9/2000 | Shinogi et al. ......................... 438/52 |

FOREIGN PATENT DOCUMENTS 54-109376    8/1979   (JP) .

OTHER PUBLICATIONS

Solder Joint Reflow Under Silicon by IR Laser, May 1994, vol. 37, No. 05, p. 99 IBM Technical Disclosure Bulletin.
Infrared Alignment Fixture for Chip Writer System, Oct. 1987, vol. 30, No. 05, pp. 87–90 IBM Technical Disclosure Bulletin.
Optical Detection of Coating Debris on Rails of a Magnetic Head Slider, Apr. 1985, vol. 27, No. 11, pp. 6810–6811, IBM Technical Disclosure Bulletin.

(List continued on next page.)

Primary Examiner—John F. Niebling
Assistant Examiner—Viktor Simkovic
(74) Attorney, Agent, or Firm—McGuireWoods, LLP; Howard G. Walter (57) ABSTRACT

A method and system for dicing a semiconductor wafer providing a structure with greatly reduced backside chipping and cracking, as well as increased die strength. Semiconductor chip structures obtained from wafers diced according to this invention are also encompassed.

11 Claims, 8 Drawing Sheets

OTHER PUBLICATIONS

IR Inspection to Detect Handling Damage, by A. Hornung, J.S. Jaspal and W.B. Roush, Jul. 1983, vol. 26, No. 2, p. 631, IBM Technical Disclosure Bulletin.

IR Phase Contrast Technique for Identifying and Locating Defects in Passivation Layers, by G.S. Hopper, J.R. Lloyd and W.B. Roush, Sep. 1982, vol. 25, No. 4, p. 1912, IBM Technical Disclosure Bulletin.

Metal Etch Monitor by J. P. Hoekstra, Feb. 1972, vol. 14, No. 9, pp. 2680–2682 IBM Technical Disclosure Bulletin.

Direct Chip Attach to Flex Substrates, Apr. 1992, vol. 34, No. 11, pp. 362–363 IBM Technical Disclosure Bulletin.

IR Alignment of Two or More Opaque Silicon Wafers by G.A. Kolb and J. Sokolowski Jul. 1979, vol. 22, No. 2, pp. 841–843, IBM Technical Disclosure Bulletin.

* cited by examiner

A) PRE-ALIGN STEP

FIG.6A

B) ALIGN TO WAFER AND DICE STEP

METHOD AND SYSTEM FOR DICING WAFERS, AND SEMICONDUCTOR STRUCTURES INCORPORATING THE PRODUCTS THEREOF

BACKGROUND OF THE INVENTION

1. Field of the Invention

The invention relates to a method and system for dicing wafers of greater die strength, and semiconductor structures incorporating the products thereof.

2. Description of the Related Art

Thin semiconductor wafers have been separated into a plurality of diced chips by a number of conventional techniques including sawing, laser scribing, mechanical scribing and cleaving, and chemical etching and cleaving.

Figure 1:
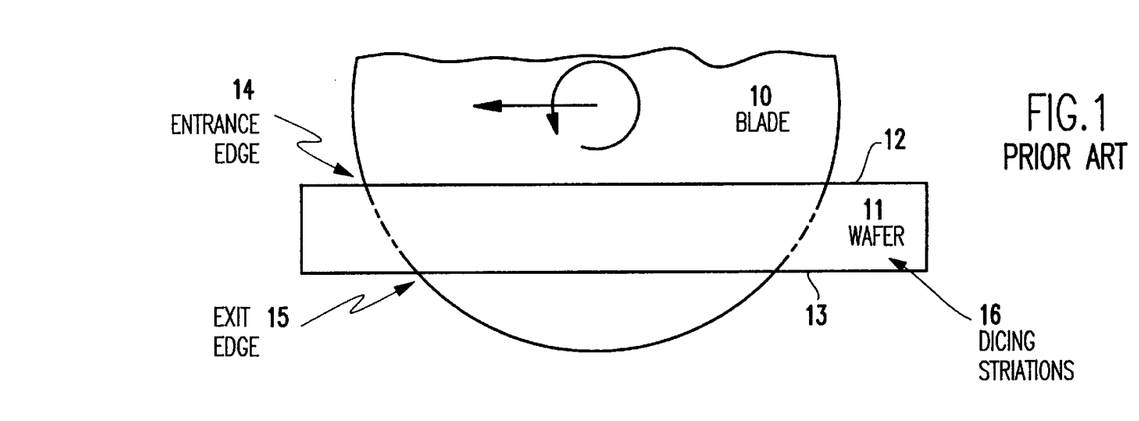
FIG. 1 is an enlarged side view in cross section illustrating a prior art method for dividing a wafer into individual die using a diamond saw blade cutting through the entire thickness of the wafer.
Figure 2A:
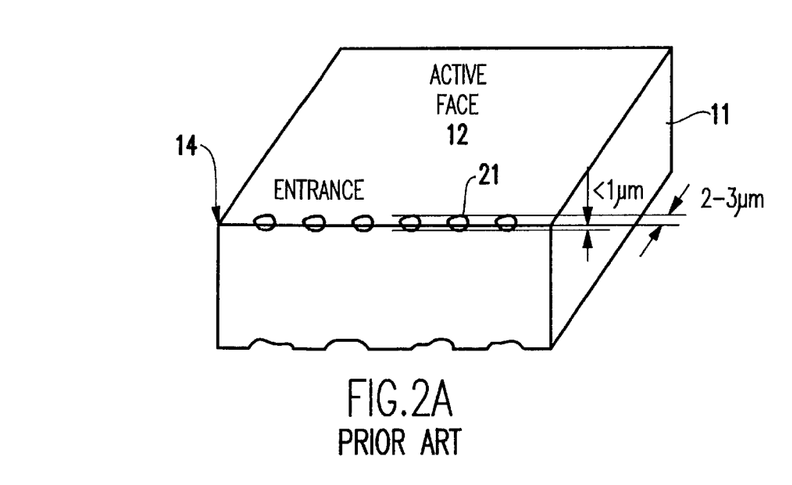
FIG. 2A is an enlarged elevational view illustrating a front side of a wafer cut into individual die using a saw blade by conventional methodology.
Figure 2B:
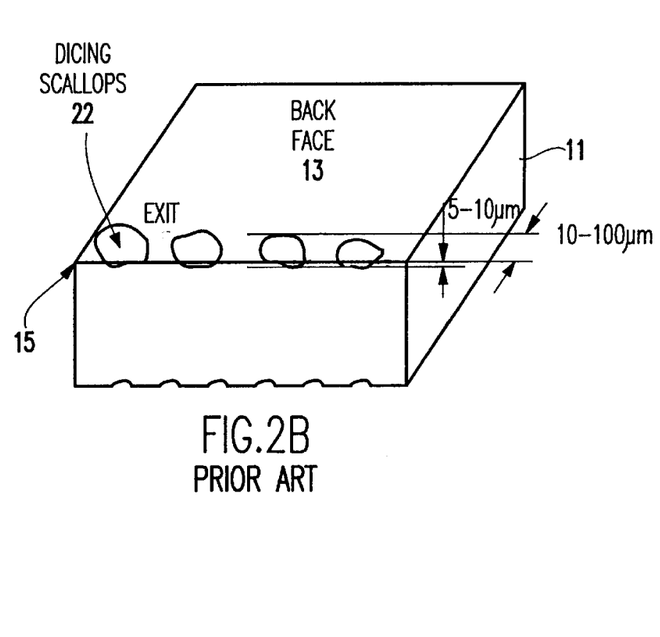
FIG. 2B is an enlarged elevational view illustrating a back side of a wafer cut into individual die using a saw blade by conventional methodology.

Referring to FIG. 1, the dicing of a wafer by sawing is illustrated in which a diamond saw blade 10 is shown with its rotational and lateral directions of motion indicated by arrows. The blade 10 has a forward entrance edge 14 cutting through the active (upper) face 12 of the semiconductor wafer 11 and an exit edge 15 at the back (bottom) side 13 of the wafer 11. Dicing striations 16 formed through the thickness of the wafer 11 by action of the sawing blade 10 are indicated. Referring now to FIGS. 2A and 2B, when a thin semiconductor wafer 10 is sawed in this manner, chipping results along the sawed edges due to the brittleness of the semiconductor. The source of damage on a diced chip 11 is the passage of the dicing blade 10 through the brittle semiconductor material, leaving microcracks and removed scallops of material along the diced edges. Such damage is not uniform, as the microcracks and scallops 21 formed on the entrance edge 14 of the chip 11 where the blade 10 enters the active wafer surface 12 are much smaller in size (e.g., about 2–3 $\mu$m) than the microcracks and scallops 22 formed on the edge 15 of the chip 11 where the blade 10 exits the back-side surface 13 of wafer 11 (e.g., about 10–100 $\mu$m).

The present investigators have determined that wafers diced in such a conventional manner with a sawing blade, e.g., a diamond saw, entering the active side, ordinarily faced up during the sawing, and exiting the non-active side, ordinarily faced down, whether by one or multiple blade passes, exhibit bi-modal chip-strength characteristics. That is, the chips flexed in bending such that the active face and diced edges are placed in tension show large strengths with little variability while those flexed such that the non-active face and diced edges are placed in tension show small strengths with large variability. Consequently, there is a connection between the damage introduced into the edges of a die as a consequence of dicing and the subsequent sustainable tensile stress or strength of the die. Small-scale damage is associated with large strength (strong chips or chip-edges, capable of sustaining large stresses) and large-scale damage is associated with small strength (weak chips or chip-edges, capable of sustaining only small stresses).

Furthermore, many packaging schemes place the back face of a chip into tension, or, at least, much more tension than the front face. This leads to loss of devices on packaging or expensive, more compliant package re-designs. There is thus a need for entrance-cut faces and edges to be placed on the faces and edges experiencing the maximum tension. This is not possible with conventional front face dicing, such as illustrated in FIG. Nos. 1, 2A–B. In cases in which the entire chip experiences significant tension, there is an analogous need for entrance cuts on both sets of edges, and, again this is not possible with conventional front face dicing.

U.S. Pat. Nos. 4,814,296 and 5,219,796 describe a v-shaped groove used in forming image sensor dies by dicing a silicon wafer. The v-shaped groove prevents cracks and chipping caused by dicing on the entrance side. The v-shaped groove described in these 4,814,296 and 5,219,796 patents is a special type of crack prevention structure that allows for dies that are going to be assembled together with butted edges with limited chipping. This represents a narrow purpose that does not necessarily require improved die strength. A wide groove is provided in the backside, apparently, so that a cut can be made from the top without having to be concerned about precise alignment when breaking through the back. The end result is a crack free and precise top surface, and no backside variations because the backside is cut away that would limit or effect how close the die could be butted together on the top surface. Also the U.S. Pat. Nos. 4,814,296 and 5,219,796 require making double parallel passes through the dicing "streets" in order to get minimum cracked surfaces on each adjoining die.

U.S. Pat. Nos. 4,721,977 and 4,900,283 teach a method for simultaneously dicing from both sides of a semiconductor wafer to obtain a beveled edge for making butted surfaces. From a practical standpoint, such a procedure described in U.S. Pat. Nos. 4,721,977 and 4,900,283 would be challenging insofar as establishing and maintaining proper registry of the opposing grooves formed by simultaneously sawing from opposing sides of the wafer.

U.S. Pat. No. 4,729,971 describes a die separation technique involving etching and other processing steps at thickened portions of a wafer to provide dice having straight and smooth diced edges. The extra processing required would be expected to entail high manufacturing costs.

As can be appreciated from the above discussions, the semiconductor industry would value a more facile technique to subdivide semiconductor wafers into dies possessing high die strength.

Another area where the conventional dicing technology has not been fully satisfactory or could be improved, as also identified by the present inventors, relates to semiconductor devices built with different technologies fabricated on separate wafers, diced, and then connected together by mounting one of the die on the other. For example, in certain packaging applications, the merging of dynamic random access memory (i.e., DRAM) and logic (as well as merging of other dissimilar technologies) has been headed towards connecting one chip directly to the face of another chip through controlled collapsed chip connection (i.e., C4) solder connections. A so-called "mother/daughter" chip structure has been used to provide a large number of inputs/outputs (i.e., I/O's) between two chips, although it can create limitations on the available area to make connections to the outside package.

Figure 8A:
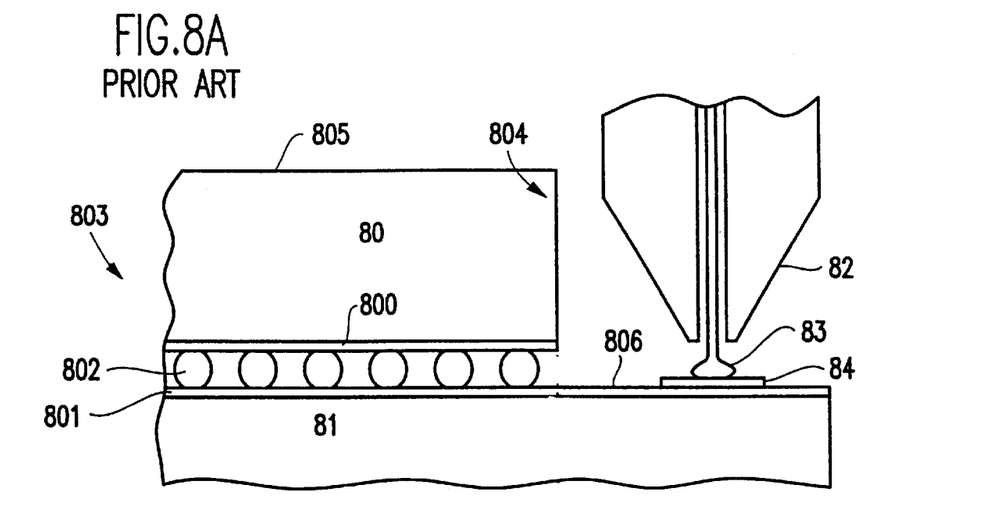
FIG. 8A is an enlarged side view in cross section illustrating a prior art mother/daughter chip arrangement where the daughter chip has squared-off side edge from dicing and a wire bond is formed on an exposed edge of the mother chip.

As illustrated in FIG. 8A, in such mother/daughter chip configuration 803, the squared-off back side edges 804 on the diced wafer back (non-active) side 805 delimit the space available for wire bonding. The front (active) side 801 of the mother chip 81 is attached to the front (active) side 800 of the daughter chip 80 by solder (C4) 802. However, when wire bonding out off the mother chip 81 using wire bonder tip 82 to deposit a wire line on pad 84, the daughter chip 80 has to be sized small enough relative to the mother chip 81 to allow for a wire bonder tip 82 to come in closely adjacent the side edge 84 of the daughter chip 80 and form the wire bond 83 on the adjacent exposed ledge 806 on the front (active) side 801 of the mother chip 81. The end result has been a conventional mother/daughter chip structure 803 such as shown in FIG. 8A. This has entailed lateral sizing constraints on the daughter chip 80, which in turn resulted in reduced real estate available on the active side 800 of the daughter chip 80 for active circuits and/or I/O's 82 between the two chips 80 and 81.

Figure 9A:
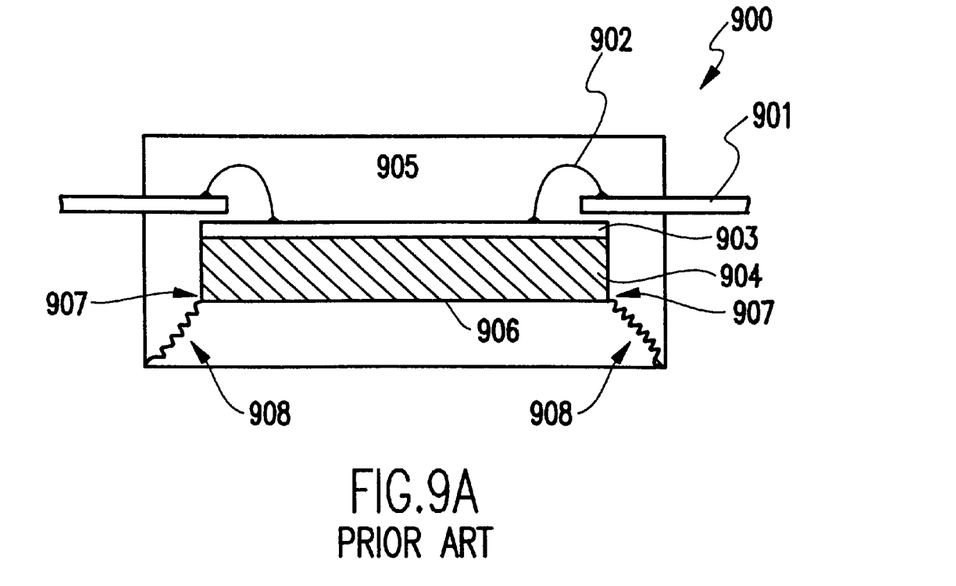
FIG. 9A is an encapsulated semiconductor package of the prior art in which the encapsulated semiconductor chip has squared-off edges at the back side of the wafer.

Also, in the packaging of a diced chip or die unit by encapsulation, problems of limited die strength have been encountered heretofore. For instance, as illustrated in FIG. 9A, the encapsulated semiconductor package 900 includes lead frames 901 wirebonded to the active side 903 of IC silicon chip 904 to provide a die unit, and the die unit is encapsulated in rigid plastic 905, such as a cured silicone potting resin. The back (non-active) side 906 of the die unit has been diced by conventional methods to provide squared-off edges 907, which act as stress risers, which, in turn, tends to be a crack initiator causing failure cracks 908 in the plastic encapsulant 905.

SUMMARY OF THE INVENTION

The present invention relates to a method and system for dicing a semiconductor wafer into dies having minimized backside chipping and microcracking, as well as increased die strength.

In one embodiment, a method is provided for processing a semiconductor structure, involving the steps of providing a plurality of chamfered edges extending from a first planar surface partially through the thickness of a semiconductor structure, and cutting grooves in a second planar surface opposite to the first planar surface in registry with the chamfered edges effective to dice the structure into a plurality of die units.

In one particular embodiment, dicing is performed from both sides partially through the thickness of a semiconductor wafer to provide two major surfaces on the die that are endowed with the high die strength by virtue of each being a dicing entrance surface. Since the entrance side of the wafer through which the dicing blade enters is left more structurally intact and thus is stronger than a side from which a blade exits, the present invention imparts increased die strength. The high die strength achieved in the present invention is important, especially as applied to dies having specifications for larger major diameter sizing in conjunction with thinner thickness dimensions.

In a further embodiment, the present invention can be implemented with a dicing tool that is equipped with an imaging system that is used to optically view through the wafer to determine the pattern of the dicing lines initially cut into the first wafer face for use as a guide in cutting the dice lines into second opposing wafer face in registry with the dice lines on the first wafer surface. The technique is facile to execute as one need only cut partially through the thickness of the wafer from a first wafer face (with cutting terminated before the blade can emerge from the opposite wafer face), and then after flipping and remounting the wafer to the dicing tool, optically alignment and cutting is performed through the second wafer face in registry with the first dicing cuts to subdivide the wafer into multiple die units. The alignment dicing tool using such imaging effectively permits dicing from both sides of the wafer forming two "entrance sides" on the die. Two blade entrance sides yields better die strength and a resulting beveled edge on both sides gives even more added strength. As a consequence of the technique, there is no need to do any special processing beyond what would already be done on the wafer to form dicing lines in a single wafer face.

In one preferred implementation of this unique alignment technique for achieving registered wafer dicing, a dicing tool or jig is outfitted with infrared (i.e., IR) optics located on a side of the wafer opposite the other side of the wafer that is being supported by an IR transparent chuck that permits IR illumination therethrough. Since semiconductor wafer materials, such as silicon, are transparent to IR light, the wafer and support chuck permit IR illumination and optical alignment to be performed from opposing sides of the wafer. This mode of the invention permits sequential aligned dicing from both sides of a wafer.

These and other objects and features of the invention will become more fully apparent from the several drawings and description of the preferred embodiments.

DETAILED DESCRIPTION OF THE PREFERRED EMBODIMENTS OF THE INVENTION

Figure 3:
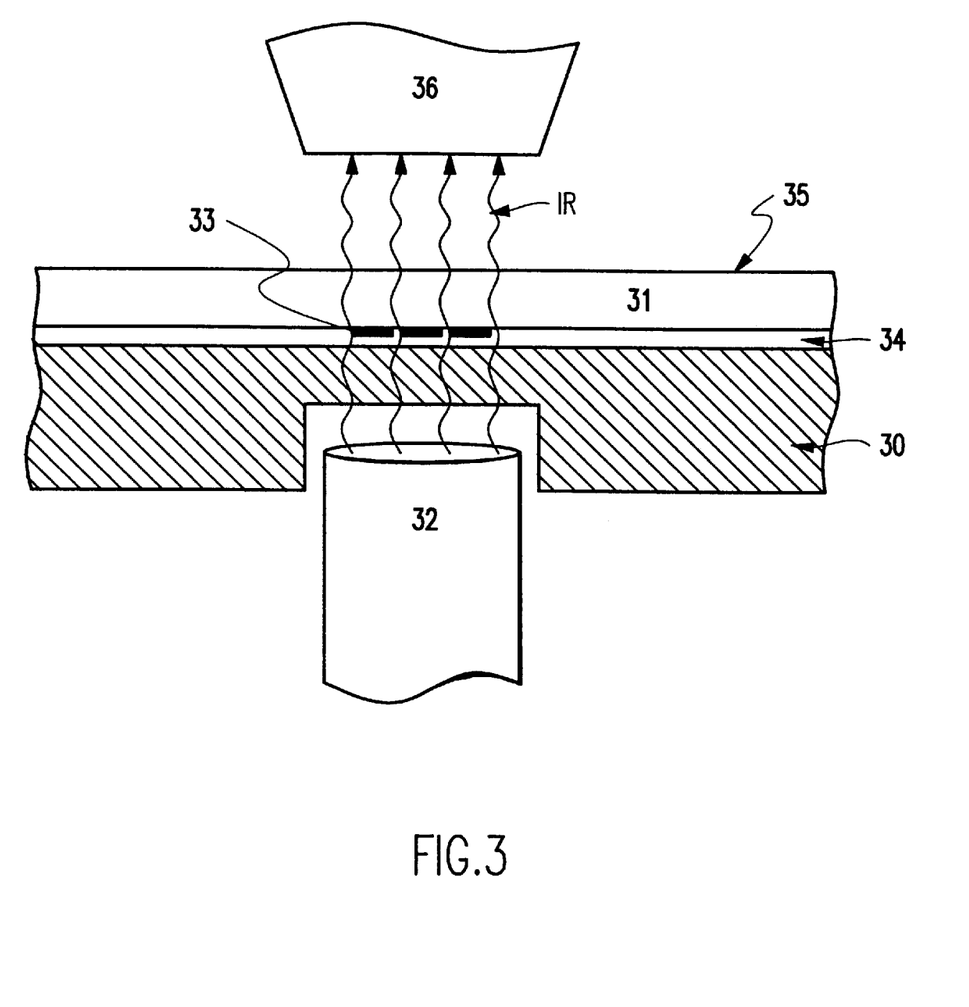
FIG. 3 is a cross sectional view of a dicing chuck and optical alignment assembly used to reference and align a pattern of back side grooves in correspondence with a pattern of alignment marks patterned upon the front side of the wafer.

With reference to the figures, and particularly FIG. 3, a dicing chuck or jig 30 is used to support a transparent semiconductor wafer 31 to be diced into individual chips or die units. The wafer is releasably mounted to the chuck with conventional wafer dicing tape (not shown). The semiconductor wafer 31 is transparent to the wavelength of light to be used to illuminate a non-light transparent (opaque) dicing alignment pattern 33 formed on the front side 34 of the wafer 31. The front side 34 of the wafer has the active circuitry. Where the semiconductor wafer 31 is silicon, it is useful to employ infrared (IR) light as the illuminating light. Infrared radiation generally has a wavelength of greater than 700 nm. The silicon wafer is transparent to, i.e., transmits, infrared light of this wavelength.

An optical assembly used includes an optical fiber 32 used to align cuts to be later formed in the wafer back side 35 with non-transparent (to IR) alignment marks patterned onto the front side 34 of the wafer 31. The non-transparent dicing alignment marks 33 are formed on the wafer front side 34 by semiconductor metal pattern processing in a step prior to the alignment step. The alignment step is accomplished by illuminating the front side 34 of the transparent semiconductor wafer 31 with a light source, such as infrared light, which passes through the front side 34 of the wafer bearing a pattern of dicing alignment marks 33 which are non-transparent to the infrared light.

In any event, the illuminated dicing alignment marks 33 form an imaged beam of light replicating the pattern of the dicing alignment marks 33 that is transmitted through the bulk thickness of the transparent wafer 31 and exits its wafer back side 35 to be detected by an infrared image detector 36 positioned above the back side 35 of the wafer 31 on a direct line from direction of the light source 32 positioned beneath the front side 34 of the wafer 31. The infrared image detector 36 can be, for example, an infrared microscope. With an infrared microscope, an observer sees a sharply delineated black object representative of the dicing alignment marks 33 on a bright background.

The optical detector 36 serves to detect and memorize the front side alignment pattern 33 as illuminated (imaged) on the back side 35 of the wafer 31. In this way, the imaged pattern of the dicing alignment marks 33 need not be physically marked on the back side 35 before dicing the alignment grooves into the back side partially through the thickness of the wafer 31.

The image (not shown) of the dicing alignment marks 33 as illuminated onto the back side 35 of the wafer 31 can be used for guiding back side dicing. Although not required, it is also possible to physically mark the image of the alignment marks by printing with ink or laser scribed for referencing for subsequent groove formation therein in the event the wafer has to be temporarily removed from the dicing support 30 and then repositioned thereon for some reason. In any event, back side dicing is used to cut partially through the thickness of the wafer along the inked or scribed lines. The back side groove cutting can be done by sawing, water jet cutting, laser cutting, and so forth.

Figure 4A:
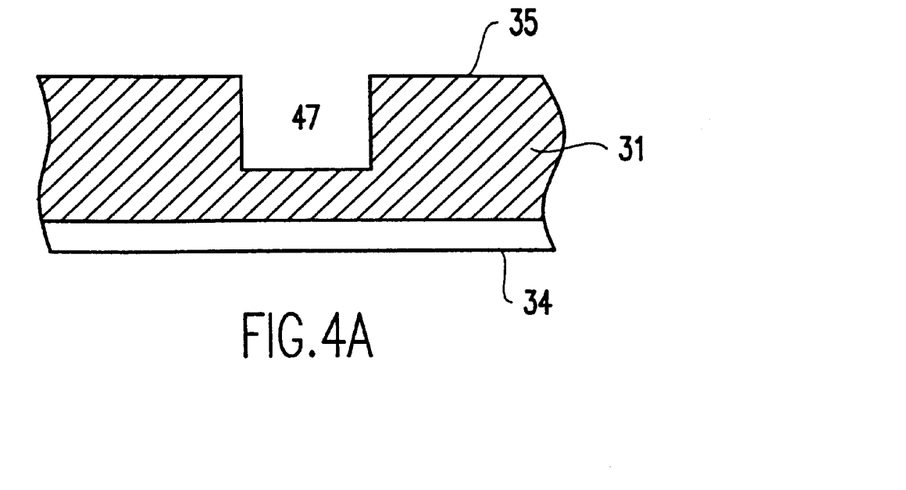
FIGS. 4A–4C are enlarged side views in cross section showing the diced edge structure of the wafer at various steps of the dicing operation using the chuck and optical alignment assembly of FIG. 3.
Figure 4B:
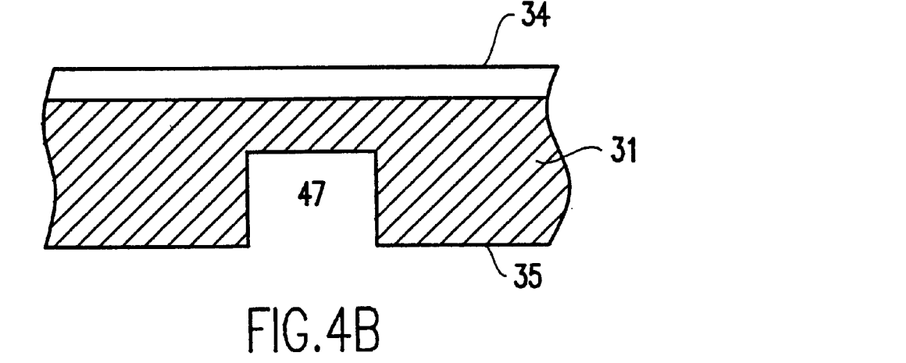
Figure 4C:
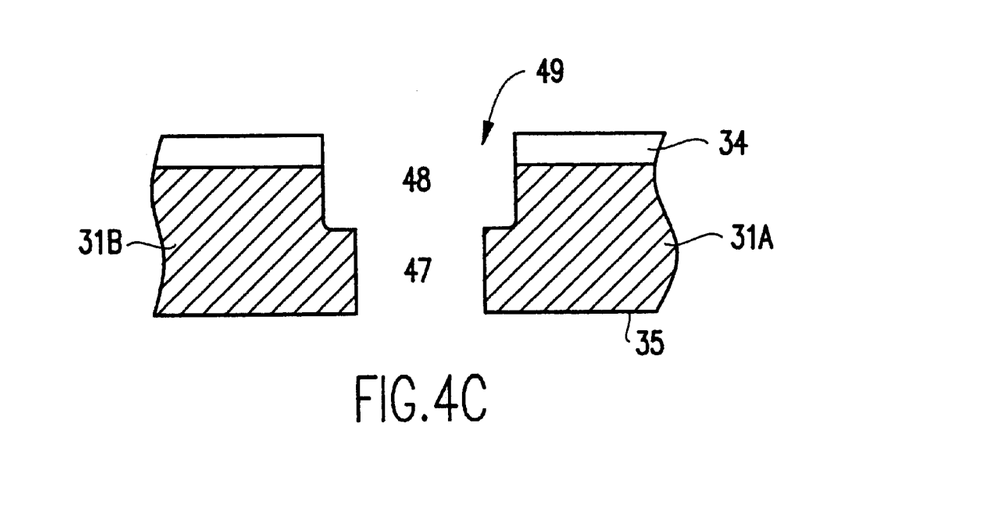

As illustrated in FIG. 4A, the dicing of the wafer 31 made partially through its thickness from the back side along the imaged alignment marks to form groove 47 can be accomplished with a diamond saw blade having either a wide blade or a beveled blade. A wide blade cut is depicted in FIGS. 4A–4C for groove 47. The wafer 31 can be releasably mounted to the dicing chuck 30 (FIG. 3) during the dicing cutting using commercially available wafer dicing tape.

As illustrated in FIGS. 4A–4B, dicing of the wafer 31 then can be completed by flipping the wafer 31 over, remounting it with dicing tape, and dicing through the front side 34 with a diamond saw, and so forth, to form a cutting path 48 reaching the depth of the backside cut 47 to effect separation of the wafer 31 into individual chips or die units 31A and 31B. In any event, the dicing from the front side 34 can track along the same previously detected IR pattern on the back side 35 to cut through the thickness of the wafer from the front side 34 to the back side 35 of the wafer 31.

While only a single dicing separation 40 through the wafer 31 is shown in the FIG. 4C for sake of simplifying the discussion, it will be appreciated that a number intersecting dice cuts will be formed in practice through the wafer to effect physical separation of one or more chips (die units) from the wafer 31.

The partial dicing through the thickness of the wafer from the backside of a semiconductor wafer according to the present invention greatly improves quality and allows different structures to be shaped into the resulting die. Entrance cuts for dicing are much stronger and cleaner than exit cuts. The double backside and frontside dice makes it possible to put strong, clean edges on both sides with other variations such as stepped or beveled cuts. Also, scatter in cutting damage and strength also are diminished for the entrance cuts used to dice the wafer according to this embodiment of the invention. The present invention also is more flexible as the back side cut does not have to be wider than the front side dicing cut, and no etched v-shaped groove along the Si (111) plane is required on the front wafer side to obtain a specified angle without cracks. Also, separate cuts for adjacent chips are not required.

FIGS. 5A–5D show various alternative types of wafer holding and supporting chucks that can be used in implementing this invention.

Figure 5A:
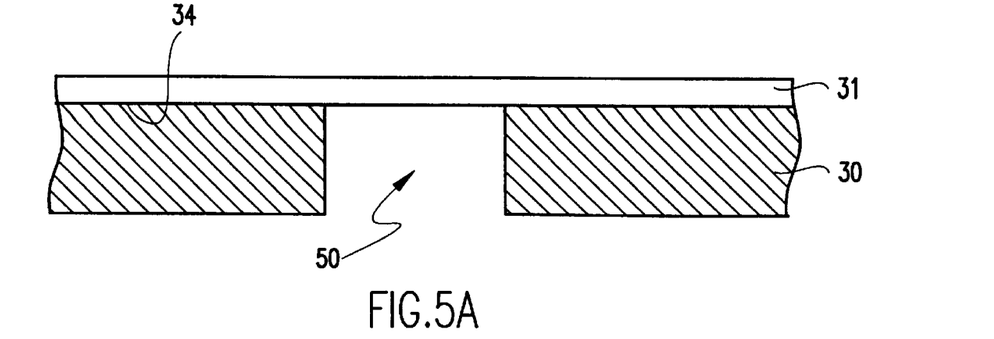
FIGS. 5A–D are cross sectional views of various wafer chuck designs useful in this invention.

FIG. 5A shows wafer 31 supported with its front (active) side 34 initially facing down on chuck 30 that is constructed of a non-IR transparent material and includes one or more through-holes 50 sized to allow transmission of IR light through the chuck body 30 to the surface area of the front side 34 of the wafer 31 bearing the pattern of non-IR transparent dicing alignment marks (marks 33 in FIG. 3). Only one through-hole 50 is depicted in FIG. 5A for the sake of simplifying the drawing. Preferably, insertion of optical fiber illumination assembly 32 (shown in FIG. 3) into closer proximity to the front side 34 of the wafer 31.

Figure 5B:
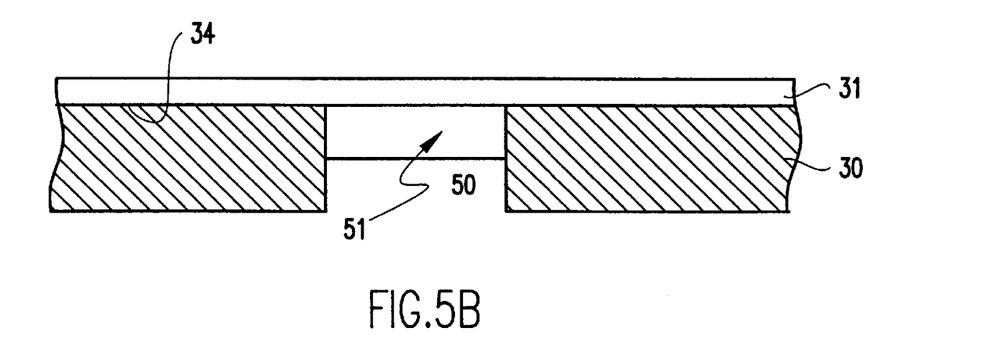

FIG. 5B shows another chuck design where the chuck 30 is constructed of a non-IR transparent material and includes a recess 50 leading to an IR transparent window lens (e.g., glass or other IR transmitting material) fixed at the bottom of the recess 50 and adjacent the front side 34 of the wafer having the dicing alignment marks. The transparent window provides a thin physical buffer to prevent physical contact between the tip of the optical fiber 32 and the front side 34 of the wafer 31.

Figure 5C:
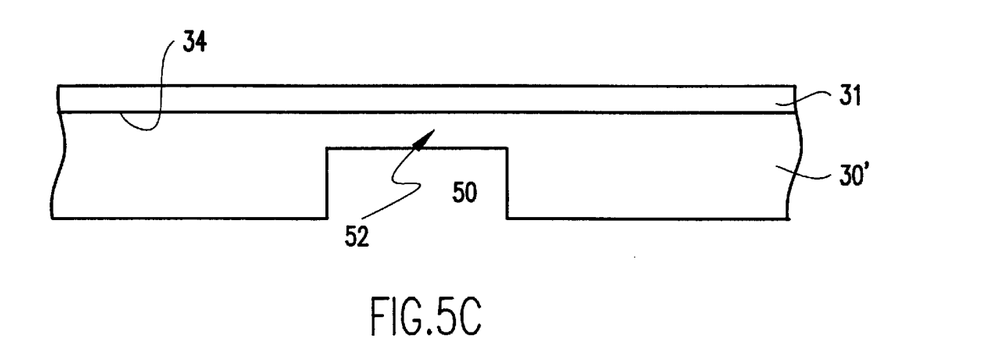
Figure 5D:
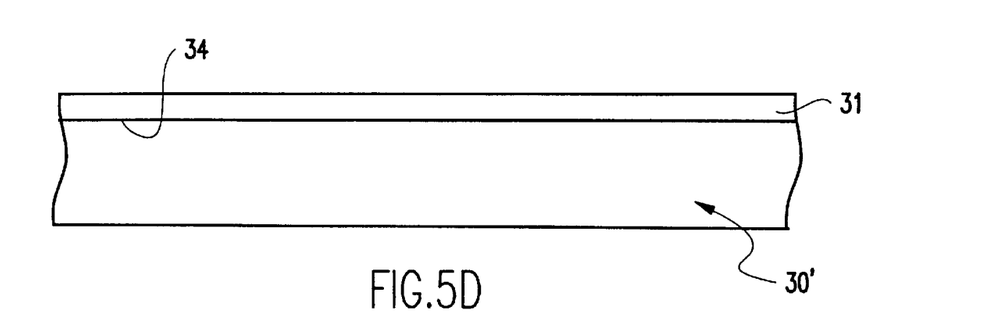

FIG. 5C shows another chuck design where chuck 30' is constructed completely of an IR transparent material (e.g., glass or other IR transmitting material) and includes a shallow recess 50 allowing transmission of IR light through the chuck body 30' to the surface area of the front side 34 of the wafer 31 bearing the pattern of non-IR transparent dicing alignment marks (marks 33 in FIG. 3), and, preferably, insertion of optical fiber assembly 32 into closer proximity to the front side 34 of the wafer 31. The chuck design of FIG. 5D is the same as that of FIG. 5C except that no recess 50 is provided or needed as the entire chuck body 30' is constructed of a material highly transparent to infrared light.

Figure 6A:
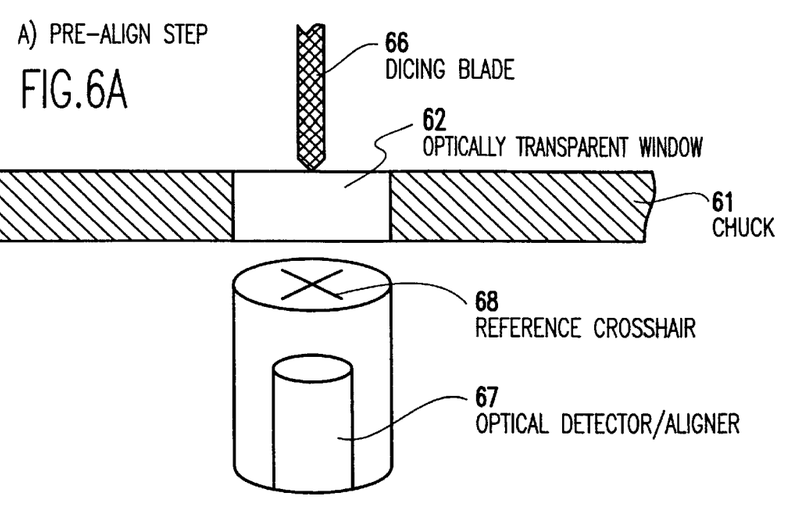
FIGS. 6A and 6B are enlarged side views in cross section showing the steps used to align a dicing chuck and optical assembly using visible light.
Figure 6B:
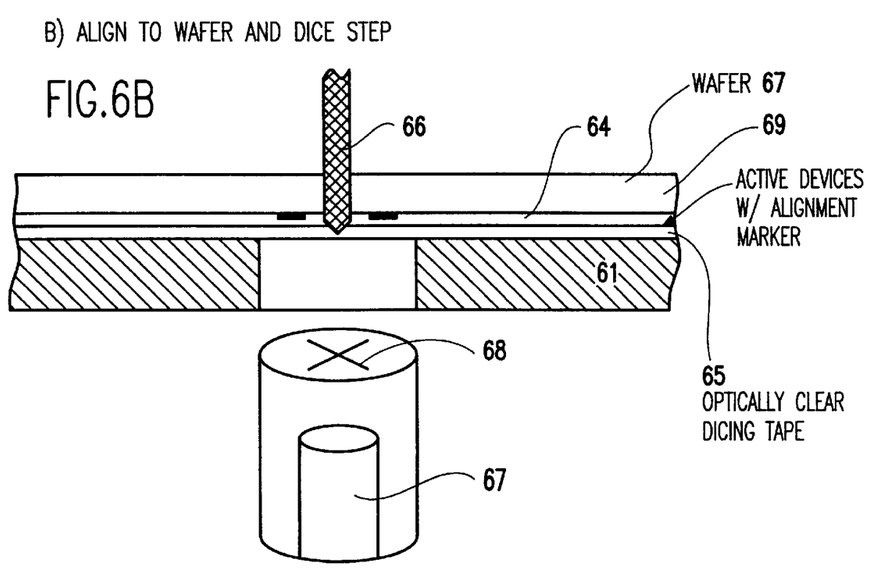

In yet another alternative embodiment illustrated in FIGS. 6A–6B, a dicing chuck 61 and optical assembly is used to align with visible light. One or more optically transparent windows 62 embedded in the dicing chuck 61 (only one is shown for sake of simplifying the illustration) are used to illuminate the wafer frontside 64 having the active devices and alignment marks and an optical detector 67 at each location aligns to the wafer frontside pattern. The location of the dicing blade 66 is pre-aligned to the locations of the detector 67, establishing a reference. This can be accomplished by focusing the alignment mechanism on the dicing blade housing. A crosshair or alignment pattern 68 on the housing is used to establish the correct reference. An optically clear dicing tape is laminated onto the front side 64 of the wafer before dice cutting. Also, the pre-alignment step can be effected without the need for the chuck to be in place.

Figure 7A:
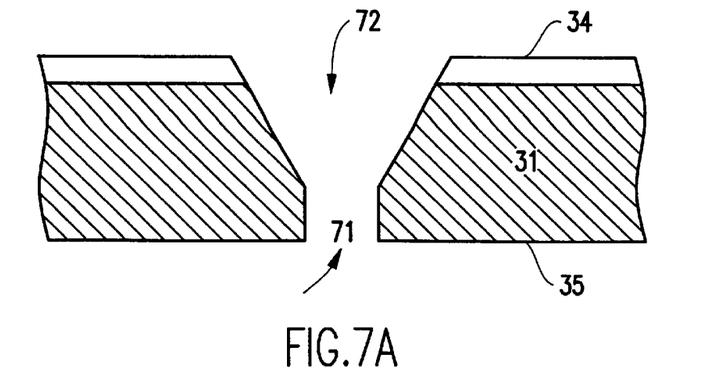
FIGS. 7A–7C are enlarged side views in cross section showing different diced edge structures possible by the present invention.
Figure 7B:
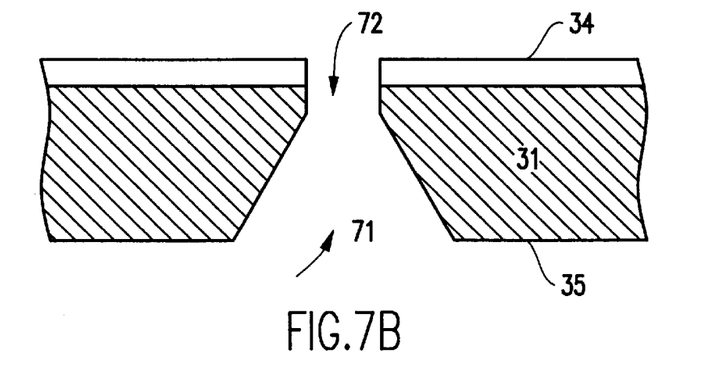
Figure 7C:
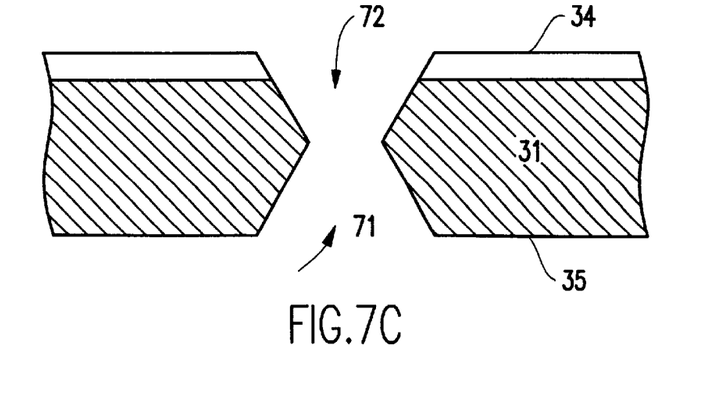

FIGS. 7A–7C show examples of the variety of diced edge structures made possible by the present invention depending on the choice of beveled edge saw blades, wide saw blades, and combinations thereof to effect the partial cut 71 from the back side 35 of the wafer 31 followed by the dicing separation cut 72 made from the front side 34 of the wafer 31.

Figure 8B:
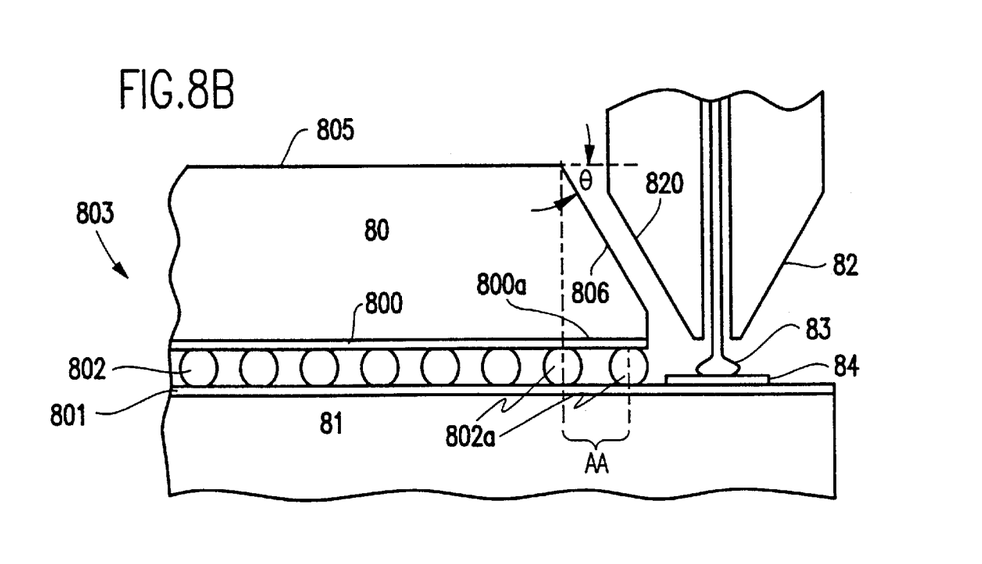
FIG. 8B is an enlarged side view in cross section illustrating a mother/daughter chip arrangement made possible according to the present invention where the daughter chip has a beveled side edge from dicing and a wire bond is formed on an exposed edge of the mother chip.

In another implementation of the invention illustrated in FIG. 8B, a chamfered backside daughter chip 80 is fabricated according to this invention whereby a large mother-daughter chip structure 803 is provided having more chip-to-chip I/O's in added-area AA. This is made possible because the daughter chip 80 has a beveled side edge 806 formed from dicing the daughter chip 80 from a wafer by dicing methods of this invention. The beveled side edge 806 of the daughter chip 80 is formed at angle e which is the same as the angle of the facing side edge 820 of the wire bonder tip 82.

The front (active) side 801 of the mother chip 81 is attached to the front (active) side 800 of the daughter chip 80 by solder (C4) 802. Wire bonding out off the mother chip 81 using wire bonder tip 82 deposits a wire line on pad 84, the daughter chip 80 with the beveled side edge 806 allows for overlapping clearance of the wire bonder tip 82 so that it can come in very closely adjacent the side edge 84 of the daughter chip 80 and form the wire bond 83 on the adjacent exposed ledge 806 on the front (active) side 801 of the mother chip 81. The end result is the mother-daughter chip structure 803.

Again, in the interaction that occurs between a wirebonder tip 82 and a mother/daughter chip device assembly 803, the area needed for bonding is governed by the angle of side edge 820 of the wirebonder tip 82. To reduce the required area on the mother chip 81 taken up for wirebonding, the backside 805 of daughter chip 80 is chamfered at angle θ using dicing techniques of this invention described herein to fit the angle of the wirebonder tip 82.

This resulting beveled structure allows for thick, chamfered daughter chips to be mounted on another chip using only the minimum surface area needed for wirebonding while allowing for both an increased number of I/O's 802a between the mother and daughter chip and an increased number of active circuits to be provided on the surface of the daughter chip. Area 800a, defined by hatched line area AA, is added on the front side 800 of the daughter chip 80 resulting from the added clearance provided by the beveled (chamfered) edge 806 for the wirebond tip 82. This structure also relieves stress between the daughter chip and any plastic package formed at the chamfered die edges. Thus, in this embodiment, a multi-chip semiconductor structure can be provided in which the backside chip can be endowed with a beveled edge which provides added clearance for a wirebond tip while effectively increasing the real estate available on the backside chip for I/O's and/or active devices allowing for higher bandwidth communication between the two chips.

Figure 9B:
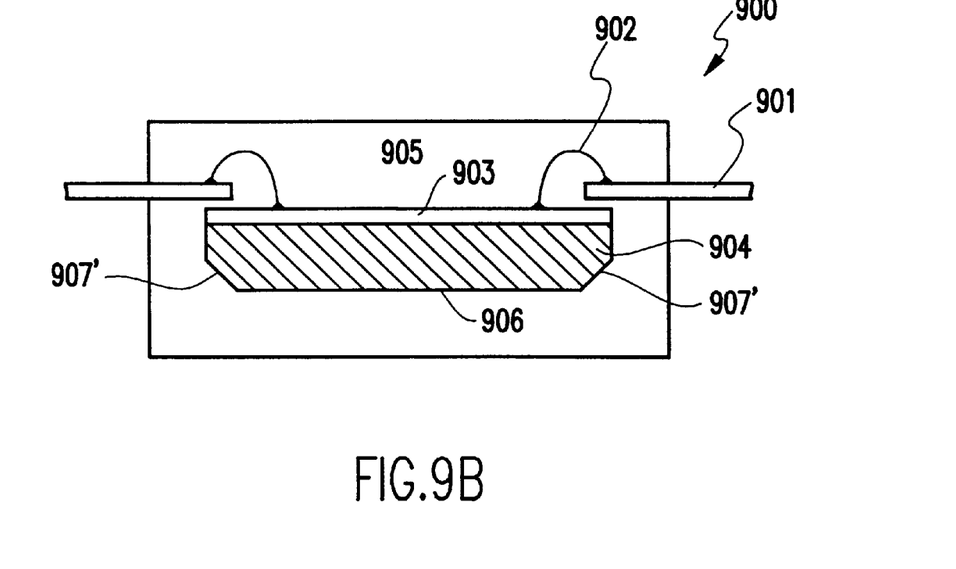
FIG. 9B is an encapsulated semiconductor package made possible by the present invention in which the encapsulated semiconductor chip has beveled edges at the back side of the wafer.

In another embodiment of this invention illustrated in FIG. 9B, an encapsulated semiconductor package 900 includes lead frames 901 wirebonded to the active side 903 of integrated circuit (IC) silicon chip 904 to provide a die unit, and the die unit is encapsulated in rigid plastic 905, such as a cured silicone potting resin. The back (non-active) side 906 of the die unit has been diced by methods according to the present invention to be endowed with beveled edges 907, which are stress relieved and thus do not cause stress cracks in the adjoining plastic encapsulant 905.

It is to be understood that this invention is not limited to any particular forms illustrated herein and that it is intended in the appended claims to cover all modifications that do not depart from the spirit and scope of this invention. For instance, the use of the IR alignment scheme described in the draft provides many options for producing diced wafers with chip strength properties optimized for various packaging or handling schemes. Three variations are as follows: a) Dice from both sides, with or without a first beveled cut, to maximize overall chip strength; or b) dice straight through from the back wafer face if the back wafer face is in tension and the front wafer face is not in tension, as the ability to use single backside dice makes it possible to put a strong entrance edge on a stressed backside of a chip; or c) double-pass from the back wafer face to give moderate strengthening of the front wafer face with no extra wafer fixturing steps during dicing. Also, an optical detector alternatively can be positioned on the back side of the wafer on a direct line from direction of the light source positioned on the front side of the wafer. The optical detector serves to detect and memorize the front side alignment pattern as illuminated (imaged) upon the back side of the wafer.

What is claimed is:

1. A method of processing a semiconductor structure, comprising the steps, in sequence, of
   a.) cutting a plurality of edges extending from a back planar surface partially through the thickness of said semiconductor structure, and
   b.) cutting grooves in a front planar surface opposite to said back planar surface in registry with said edges effective to dice said structure into a plurality of die units, wherein said cutting in step a.) forms a chamfer.

2. A method as recited in claim 1, wherein, in said cutting step (b), infrared light is used to provide alignment with said edges.

3. A method as recited in claim 1, wherein said grooves cut in step (b) are selected from the group consisting of chamfered edges and straight edges.

4. A method of dicing semiconductors, comprising the steps, in sequence, of:
   a) providing a wafer having a front major side and an opposite back major side, said wafer having a thickness dimension extending normally between said front and back major sides;
   b) partially cutting through said wafer in said thickness dimension from said back major side to provide a bevelled trench in said wafer; and
   c) cutting through said wafer from said front major side in registry with said trench and subdivide said wafer.

5. The method of claim 4, further comprising a step of aligning said partial cutting from said front major side with said cutting from said back major side.

6. The method of claim 5, wherein infrared light is used for said aligning step.

7. The method of claim 6, wherein said wafer is transparent to IR light.

8. The method of claim 4, wherein said cutting from said front major side provides a bevelled cut edge in said wafer.

9. The method of claim 4, wherein said first major side includes active devices.

10. A method as recited in claim 1, wherein at least one of said cutting steps is performed by a process selected from the group consisting of sawing, water jet cutting and laser cutting.

11. A method as recited in claim 5, wherein at least one of said cutting steps is performed by a process selected from the group consisting of sawing, water jet cutting and laser cutting.

* * * * *